(12) United States Patent
Subat

(10) Patent No.: US 9,049,811 B2
(45) Date of Patent: Jun. 2, 2015

(54) CIRCUIT COOLING

(71) Applicant: Bose Corporation, Framingham, MA (US)

(72) Inventor: Bradford Kyle Subat, Northborough, MA (US)

(73) Assignee: Bose Corporation, Framingham, MA (US)

( * ) Notice: Subject to any disclaimer, the term of this patent is extended or adjusted under 35 U.S.C. 154(b) by 288 days.

(21) Appl. No.: 13/688,734

(22) Filed: Nov. 29, 2012

(65) Prior Publication Data

US 2014/0146481 A1    May 29, 2014

(51) Int. Cl.
*H05K 7/20*    (2006.01)
*H05K 13/04*   (2006.01)
*H01L 23/473*  (2006.01)

(52) U.S. Cl.
CPC ......... *H05K 13/046* (2013.01); *Y10T 29/49826* (2015.01); *H05K 7/20445* (2013.01); *H05K 7/2049* (2013.01)

(58) Field of Classification Search
CPC ............. H05K 7/20; H05K 7/20218–7/20381; H01L 23/473
USPC ........................ 361/679.46–679.54, 688–723, 361/749–750; 165/80.1–80.5, 104.33, 185; 174/15.1–15.2, 16.1–16.3, 521, 526, 174/547–548; 257/718–719, 722; 24/453, 24/458–459
See application file for complete search history.

(56) References Cited

U.S. PATENT DOCUMENTS

| | | | |
|---|---|---|---|
| 5,065,279 A | 11/1991 | Lazenby et al. | |
| 5,274,193 A | 12/1993 | Bailey et al. | |
| 5,712,765 A | 1/1998 | Lehrmann et al. | |
| 5,734,556 A * | 3/1998 | Saneinejad et al. | 361/719 |
| 5,805,419 A * | 9/1998 | Hundt et al. | 361/719 |
| 5,965,937 A | 10/1999 | Chiu et al. | |
| 6,025,991 A | 2/2000 | Saito | |
| 6,034,874 A | 3/2000 | Watanabe | |
| 6,043,984 A * | 3/2000 | Tseng | 361/704 |
| 6,049,459 A * | 4/2000 | Edmonds et al. | 361/707 |
| 6,081,424 A | 6/2000 | Mach et al. | |
| 6,229,706 B1 * | 5/2001 | Cook et al. | 361/719 |
| 6,266,244 B1 | 7/2001 | Guthrie | |

(Continued)

FOREIGN PATENT DOCUMENTS

| | | |
|---|---|---|
| DE | 10246577 A1 | 4/2004 |
| EP | 0634890 A1 | 1/1995 |
| JP | H08236972 A | 9/1996 |

OTHER PUBLICATIONS

International Search Report and Written Opinion dated Feb. 12, 2014 for International application No. PCT/US2013/071674.

*Primary Examiner* — Michail V Datskovskiy
*Assistant Examiner* — Razmeen Gafur

(57) ABSTRACT

An apparatus (e.g., an audio amplifier) includes a housing cover configured to be fitted to a heat sink for enclosing a circuit board therebetween. The apparatus also includes a contact member formed separately from and mounted to the housing cover to cause electrical components on the circuit board to engage with the heat sink when the housing cover is fastened to the heat sink. The contact member includes first and second projections connected to each other and configured such that displacement of the first projection in a first direction causes a proportional displacement of the second projection in a second direction opposite the first direction.

17 Claims, 23 Drawing Sheets

(56) References Cited

U.S. PATENT DOCUMENTS

| | | | |
|---|---|---|---|
| 6,317,325 B1 | 11/2001 | Patel et al. | |
| 6,417,563 B1 * | 7/2002 | Halderman et al. | 257/718 |
| 6,442,026 B2 * | 8/2002 | Yamaoka | 361/704 |
| 6,618,252 B2 | 9/2003 | Choi | |
| 6,646,880 B1 | 11/2003 | Liu | |
| 6,667,884 B1 | 12/2003 | Lee et al. | |
| 6,742,573 B2 * | 6/2004 | Sasaki et al. | 165/80.3 |
| 7,019,971 B2 * | 3/2006 | Houle et al. | 361/699 |
| 7,082,034 B2 | 7/2006 | Tiwari et al. | |
| 7,546,943 B2 * | 6/2009 | Barina et al. | 228/44.7 |
| 8,245,764 B2 * | 8/2012 | Eriksen | 165/80.4 |
| 8,270,170 B2 * | 9/2012 | Hughes et al. | 361/710 |
| 8,693,200 B2 * | 4/2014 | Colgan et al. | 361/702 |
| 2003/0090875 A1 | 5/2003 | Fitzgerald et al. | |
| 2003/0106670 A1 * | 6/2003 | Lee et al. | 165/80.3 |
| 2003/0150605 A1 | 8/2003 | Belady et al. | |
| 2003/0174469 A1 | 9/2003 | Morelock | |
| 2004/0062007 A1 * | 4/2004 | Hsieh et al. | 361/703 |
| 2004/0212963 A1 * | 10/2004 | Unrein | 361/704 |
| 2005/0128713 A1 * | 6/2005 | Schmidberger | 361/719 |
| 2005/0129258 A1 * | 6/2005 | Fincham | 381/160 |
| 2005/0219822 A1 | 10/2005 | Tiwari et al. | |
| 2005/0231918 A1 * | 10/2005 | Goldmann | 361/704 |
| 2006/0158857 A1 * | 7/2006 | Luckner et al. | 361/719 |
| 2007/0008707 A1 | 1/2007 | Coutu | |
| 2007/0109750 A1 * | 5/2007 | Lee et al. | 361/719 |
| 2007/0159799 A1 * | 7/2007 | Dando et al. | 361/709 |
| 2008/0186681 A1 | 8/2008 | Deck et al. | |
| 2008/0225484 A1 * | 9/2008 | Brodsky et al. | 361/699 |
| 2009/0168360 A1 * | 7/2009 | Negrut | 361/710 |
| 2011/0157832 A1 * | 6/2011 | Hongo | 361/707 |

* cited by examiner

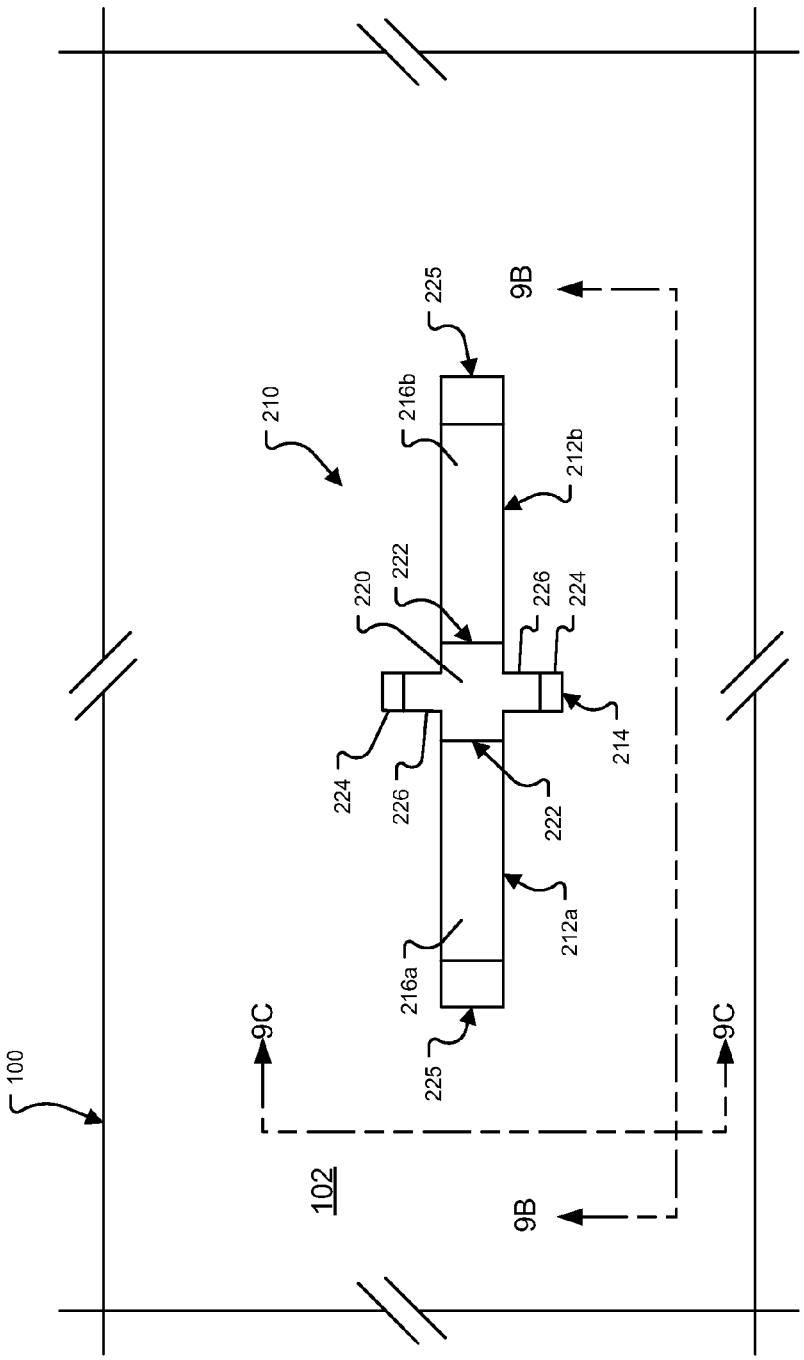

CIRCUIT COOLING

BACKGROUND

This description relates to methods and apparatus for dissipating heat from electrical components located within a housing.

In amplifiers and other electrical devices, various electrical components contained within the device housing generate heat while operating and require cooling for proper operation. In one example, the electrical components are integrated circuits mounted to a circuit board which are cooled by dissipating heat generated to the ambient surroundings. Improved heat transfer and cooling of the electrical components is accomplished by positioning the electrical components proximate to a heat sink. Heat sinks are generally large metallic structures made from a highly heat conductive material, such as aluminum, for example, and include an expansive surface area formed by a number of fins for improved convective heat transfer to the ambient surrounding. The heat sink itself can form the chassis for the electrical device, housing a circuit board populated with electrical components, for example. In particular, amplifiers designed for vehicle audio systems have unique cooling requirements given the typical physical limitations for mounting the amplifier in the vehicle and the relatively high power levels and number of audio channels.

As shown in FIG. 1, an amplifier 20 includes a heat sink 25 which forms a chassis for supporting the electrical components of the amplifier. The heat sink has cooling fins 30 which extend from at least one surface of the heat sink and a substantially planar housing cover 35. As shown in FIG. 2, with the cover removed from the heat sink, a circuit board 40 includes one or more electrical components. Referring to FIGS. 3A and 3B, the circuit board supports electrical components 45a, 45b, 45c and 45d (collectively 45), which may be integrated circuits, for example. The reverse side of the circuit board is shown in FIG. 3B, with the corresponding locations of the electrical components 45 shown in phantom. The circuit board is disposed in the heat sink such that the electrical components are in substantial contact with component pads 50a, 50b (FIG. 5) of the heat sink 25. The component pads extend from the heat sink toward the electrical components to provide a conductive thermal pathway for heat dissipation to the ambient surroundings.

Referring to FIG. 4, housing cover 35 is secured to the heat sink with fasteners extending through screw holes 55 and includes projections 60a, 60b, 60c and 60d (collectively, 60) and can include a number of ventilation holes 70. The location of the projections correspond to the location of the electrical components 45 on the circuit board, such that when the housing cover is fastened to the heat sink, the projections 60 engage the electrical components between the component pads 50 and the circuit board. In so doing, resistance to heat transfer from the components to the heat sink is reduced, and the heat generated in the electrical components is more effectively transferred to the heat sink.

With reference to FIG. 5, two adjacent component pads 50a, 50b can have different heights, as can the associated projections 60a, 60b and/or the electrical components 45a, 45b, when accounting for stack-up tolerances. When the electrical components 45a, 45b are adjacent to one another, the associated projections are located adjacent one another. Given the close proximity of projection 60a to 60b (and similarly, 60c to 60d), vertical movement of projection 60a is strongly coupled to the movement of projection 60b. Accordingly, if projection 60a presses the electrical component 45a against component pad 50a, projection 60b will be limited by projection 60a, as both proximally extend from the same substantially rigid cover. The disparities in height noted above can lead to a gap 63 between electrical component 45b and projection 60b that interrupt or diminish proper cooling of the electrical components.

Attempts to reduce or bridge this gap and improve the cooling of the electrical components are described in U.S. Pat. No. 7,082,034. In this regard, U.S. Pat. No. 7,082,034 describes a housing cover to cause electrical components to engage with at least one component pad of a heat sink. The housing cover includes one or more projections which are integrally formed from the housing cover and positioned for biasing the electrical components against the component pad. The housing cover also includes a mechanism that permits a vertical displacement of the projection relative to the vertical displacement of the housing cover. Slots extend around at least part of the projection so as to substantially decouple vertical displacement of the projections from a vertical displacement of the housing cover. In some cases, a linkage is attached to adjacent ones of the projections such that an upward deflection of a first one the projections results in a downward deflection of the other, adjacent projection. While such configurations can be effective to reduce gaps between the electrical components and the heat sink, the incorporation of slots into the housing cover can allow moisture and debris into the region of the circuit board.

Other attempts to reduce or bridge this gap and improve the cooling of the electrical components include the use of intermediate elements between the electrical component and the component pads such as clips, springs, gels, putty, or foam, for example. Such measures add additional components and cost to the manufacturing and assembly process and may not always maintain sufficient contact between the electrical component and the component pad, which may lead to overheating and failure of the electrical components.

SUMMARY

In one aspect, an apparatus includes a housing cover configured to be fitted to a heat sink for enclosing a circuit board therebetween. The apparatus also includes a contact member formed separately from and mounted to the housing cover to cause electrical components on the circuit board to engage with the heat sink when the housing cover is fastened to the heat sink. The contact member includes first and second projections connected to each other and configured such that displacement of the first projection in a first direction causes a proportional displacement of the second projection in a second direction opposite the first direction.

Implementations may include one or more of the following features.

In some implementations, the contact member is mounted to the housing cover in a manner which does not introduce an opening between an inner surface of the housing cover and an opposite, outer surface of the housing cover.

In certain implementations, the contact member is mounted to the housing cover via a mechanical interlock formed by the contact member and the housing cover.

In some implementations, the first and second projections are configured to pivot about a pivot point such that displacement of the first projection in a first direction causes a proportional displacement of the second projection in a second direction opposite the first direction.

In certain implementations, the contact member includes a base that is mounted to the housing cover, and first and second spring fingers that are connected together and connected to the base such that the first and second spring fingers pivot together relative to the base. The first spring finger defines the first projection and the second spring finger defines the second projections.

In some implementations, the contact member includes a pair of wings connecting the base to the first and second spring fingers.

In certain implementations, the base includes a pair of feet mounted on the inner surface, wherein the wings connect the feet to the first and second spring fingers.

In some implementations, the contact member includes a cross-member connecting the first and second spring fingers to the wings, and the contact member is configured such that, when a force applied to the circuit board by the first and second spring fingers exceeds a predetermined force, the cross-member is displaced towards the housing cover, thereby to limit stress on the electronic components.

In certain implementations, the contact member includes a cross-member connecting the first and second spring fingers to the wings. The cross-member can include a boss for added stiffness.

In some implementations, cutouts are formed in the wings proximal to the cross-member for reduced torsional resistance, thereby to facilitate rotation of the first and second spring fingers relative to the base.

In certain implementations, the wings are configured to buckle when a force applied to the circuit board by the first and second spring fingers exceeds a predetermined force, thereby to limit stress on the electronic components.

In some implementations, distal ends of the first and second spring fingers contact an inner surface of the housing cover and slide along the inner surface as the first and second spring fingers are displaced towards the housing cover.

In certain implementations, the first and second projections are configured such that compression of the first projection causes a displacement of fluid, which, in turn, causes a proportional expansion of the second projection.

In some implementations, the first projection defines a first fluid chamber and the second projection defines a second fluid chamber in fluid communication with the first fluid chamber.

In certain implementations, the contact member includes a fluid conduit fluidically connecting the first and second fluid chambers.

In some implementations, the contact member includes a base that is mounted to the housing cover. The base at least partially defines the fluid conduit.

In certain implementations, the base and the housing cover together define the fluid conduit.

In some implementations, the contact member is formed of a compliant polymer (e.g., silicone or a urethane polymer).

In certain implementations, the contact member is mounted to the housing cover via pressure sensitive adhesive.

In another aspect, an audio amplifier includes a circuit board, electrical components disposed on the circuit board, and a heat sink containing the circuit board and configured for dissipating heat from the electrical components. The audio amplifier also includes a housing cover configured to be fitted to the heat sink such that an inner surface of the housing cover is substantially parallel to the circuit board and configured to cause the electrical components to engage with the heat sink. A contact member is formed separately from and is mounted to the housing cover to cause the electrical components to engage with the heat sink. The contact member includes first and second projections connected to each other and configured such that displacement of the first projection in a first direction causes a proportional displacement of the second projection in a second direction opposite the first direction.

Implementations may include any of the above features and/or the following.

In some implementations, the audio amplifier is configured for use in a vehicle sound system.

Another aspect features a method of manufacturing a housing cover for an amplifier. The method includes mounting a contact member to the housing cover. The contact member includes first and second projections connected to each other and configured such that displacement of the first projection in a first direction causes a proportional displacement of the second projection in a second direction opposite the first direction. The method also include fitting the housing to a heat sink containing a circuit board such that first and second projections engage a first surface of the circuit board to cause electrical components disposed on an opposite, second surface of the circuit board to engage with the heat sink.

Implementations may include any of the above features.

Implementations can provide one or more of the following advantages.

Some implementations help to reduce gaps between electrical components and a heat sink in an audio amplifier in a manner that does not introduce openings or holes in a housing cover of the amplifier and can thereby inhibit moisture and foreign particles from entering the audio amplifier.

Certain implementations help to reduce gaps between electrical components and a heat sink in an audio amplifier by taking advantage of the potential height mismatch of component tolerance stacks.

Some implementation provide an amplifier (e.g., an audio amplifier) which has improved thermal contact between its electrical components and its heat sink and which also has improved water resistance.

Certain implementations take advantage of a potential height mismatch of component tolerance stacks to help reduce gaps between electrical components and a heat sink and thereby reduce thermal resistance between the electrical components and the heat sink which can allow for improved heat transfer.

BRIEF DESCRIPTION OF THE DRAWINGS

FIG. 9A is a plan view of an alternative implementation of a contact member that includes pivotable spring fingers for engaging portions of a circuit board.

DETAILED DESCRIPTION

Figure 1:
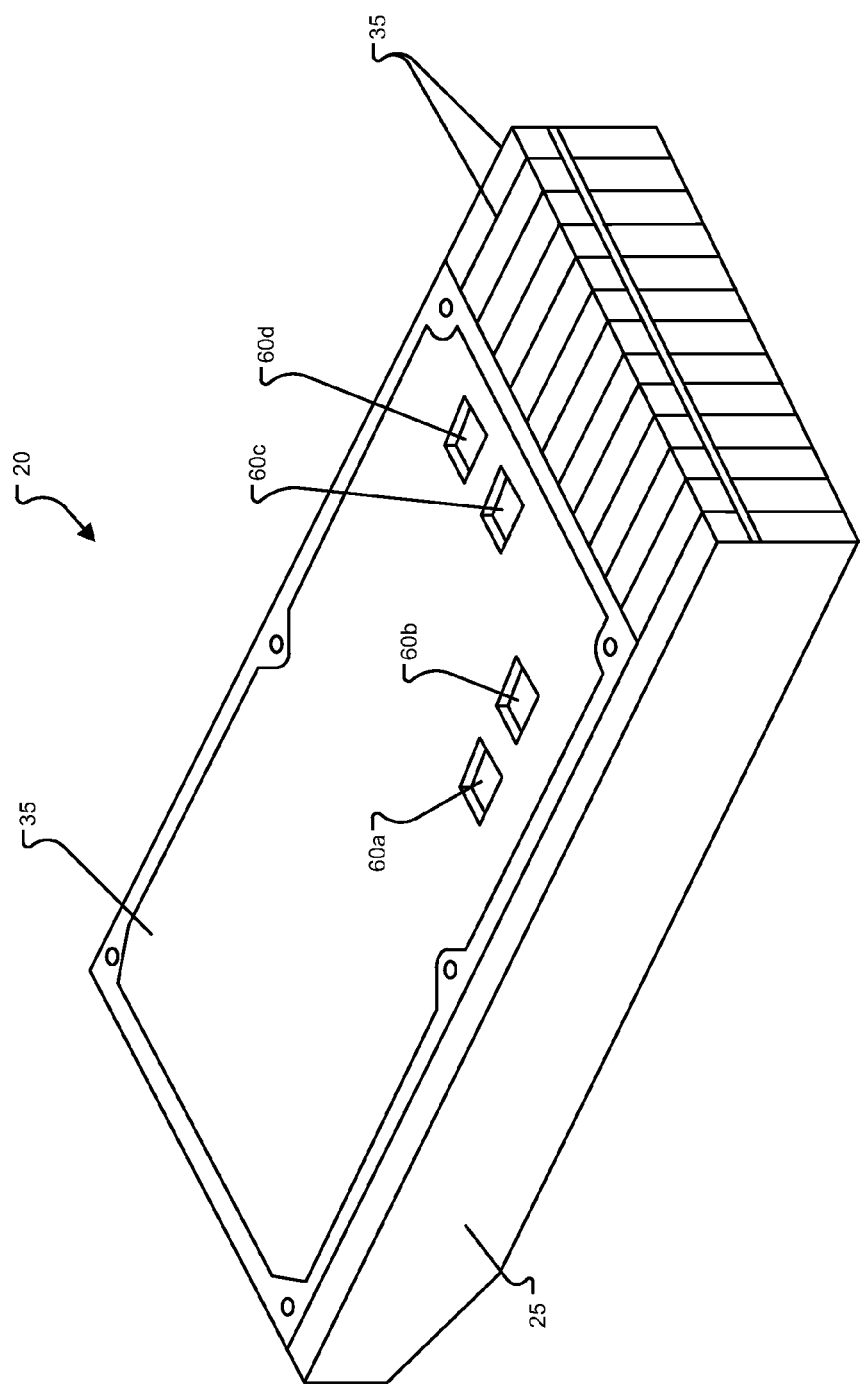
FIG. 1 is a perspective view of an amplifier.
Figure 2:
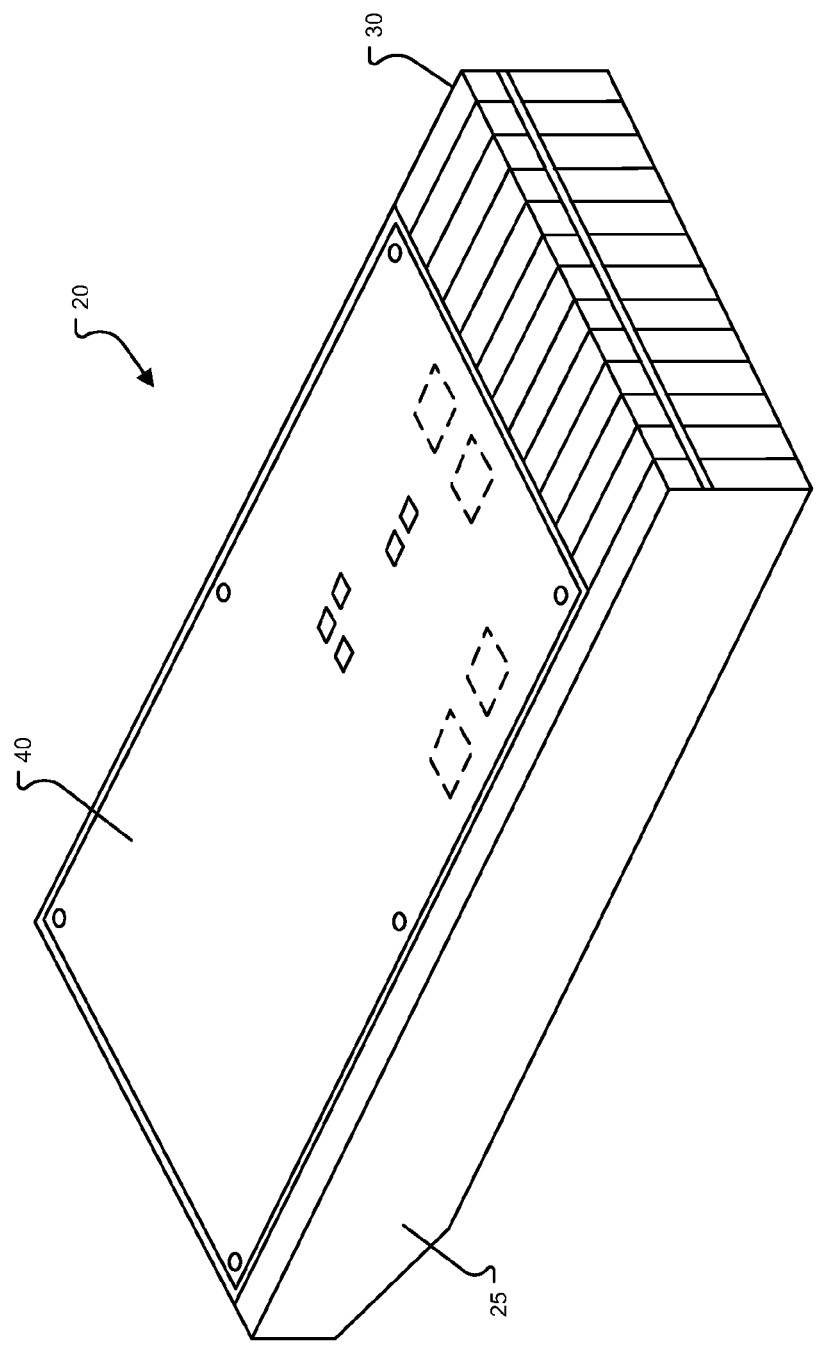
FIG. 2 is a perspective view of the amplifier of FIG. 1 with a housing cover removed revealing a circuit board populated with electrical components.
Figure 3A:
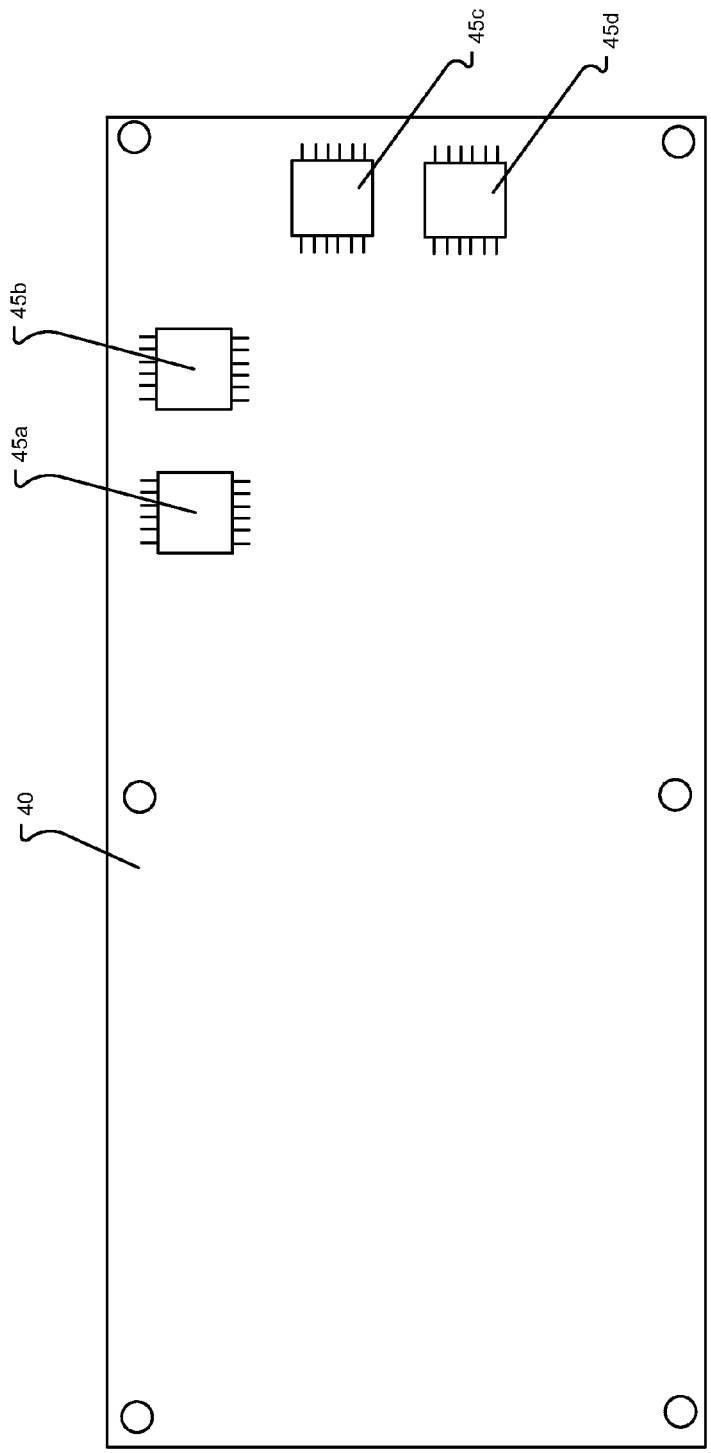
FIGS. 3A and 3B are plan views of the circuit board of the amplifier of FIG. 2.
Figure 3B:
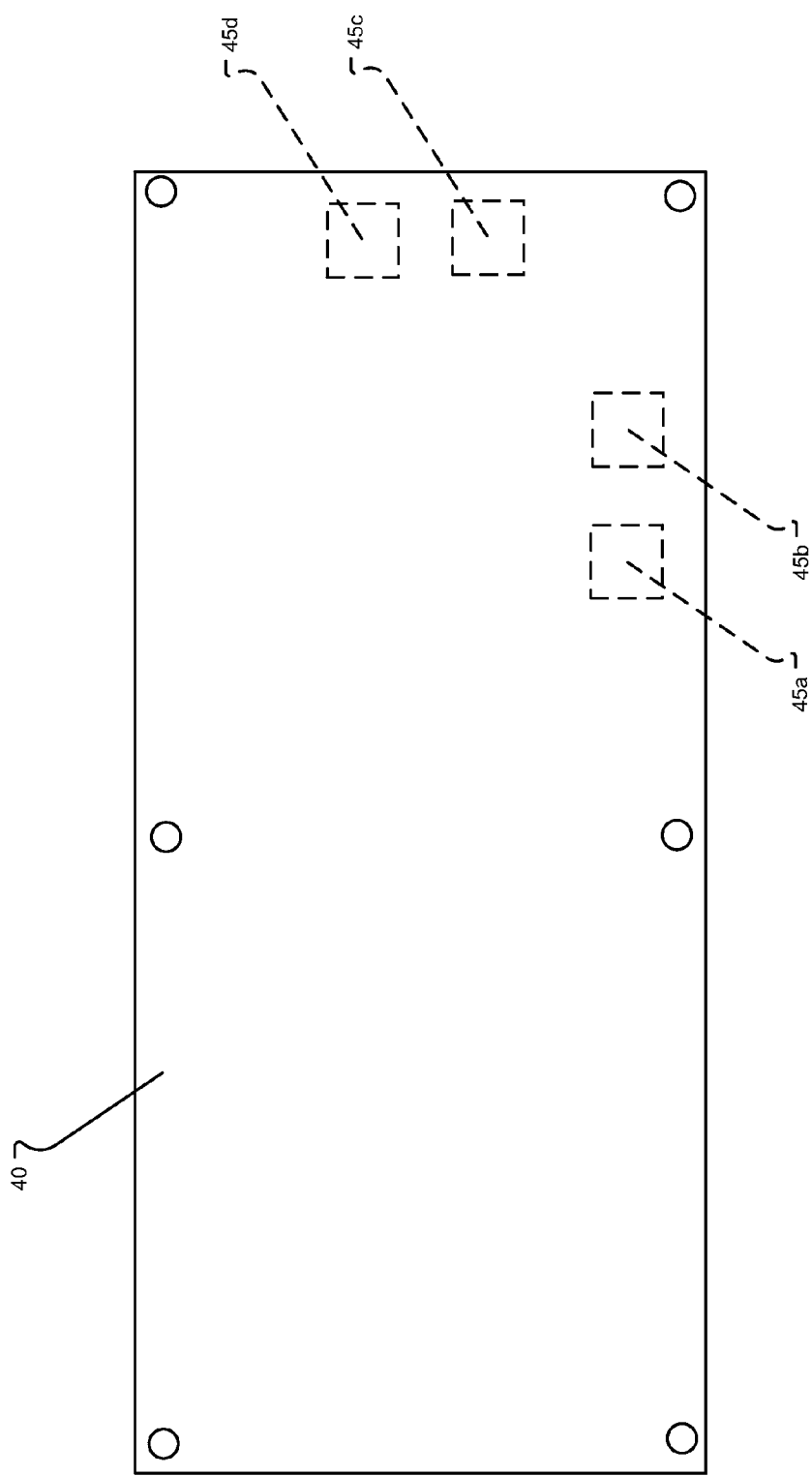
Figure 4:
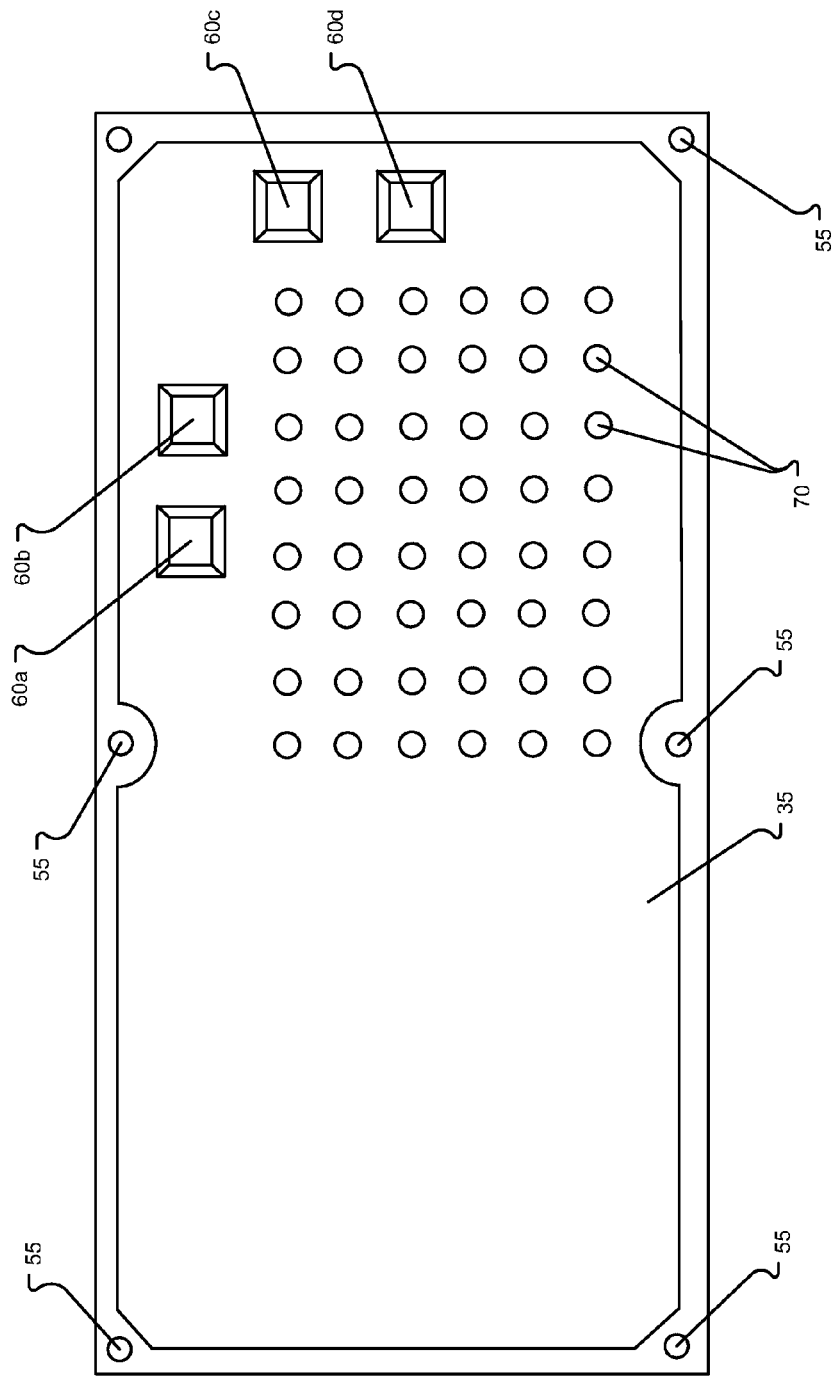
FIG. 4 is a plan view of a housing cover having projections for engaging portions of the circuit board of FIGS. 3A and 3B.
Figure 5:
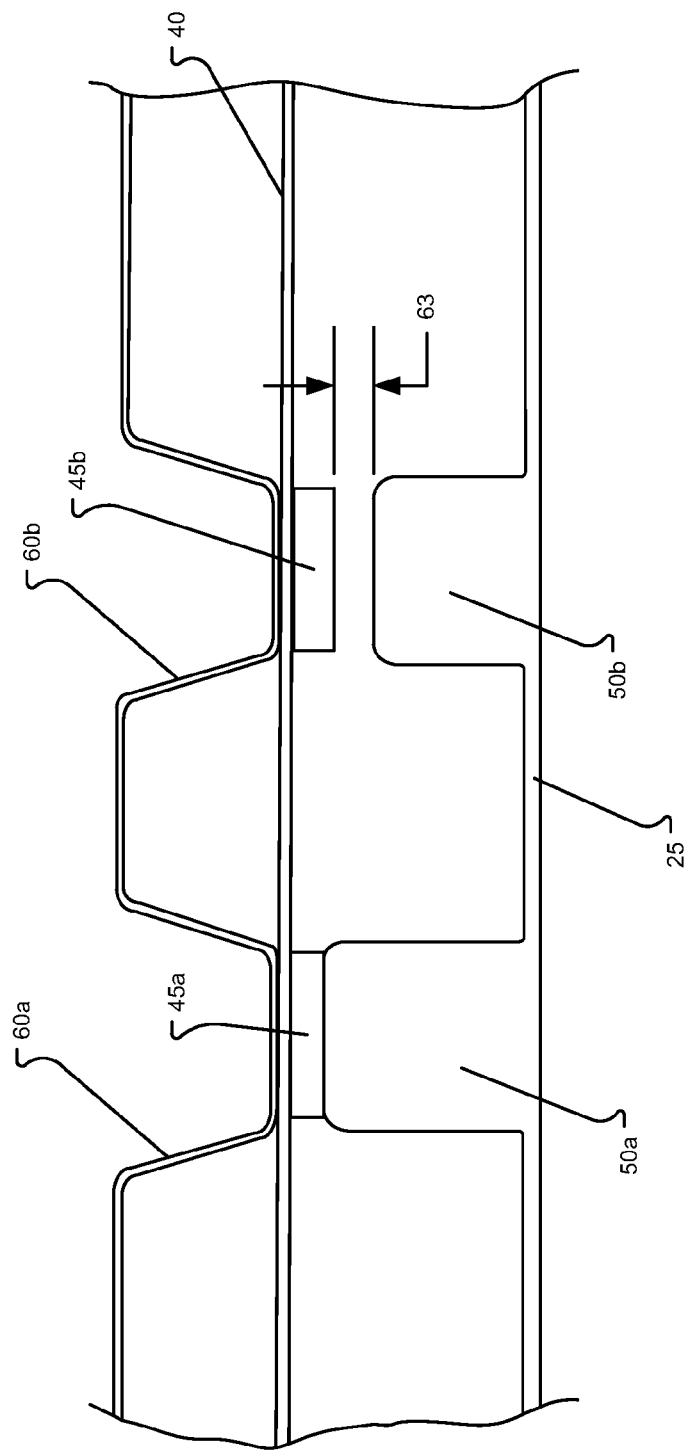
FIG. 5 is a cross-sectional view of the circuit board of FIG. 4 disposed between the housing cover and heat sink.
Figure 6:
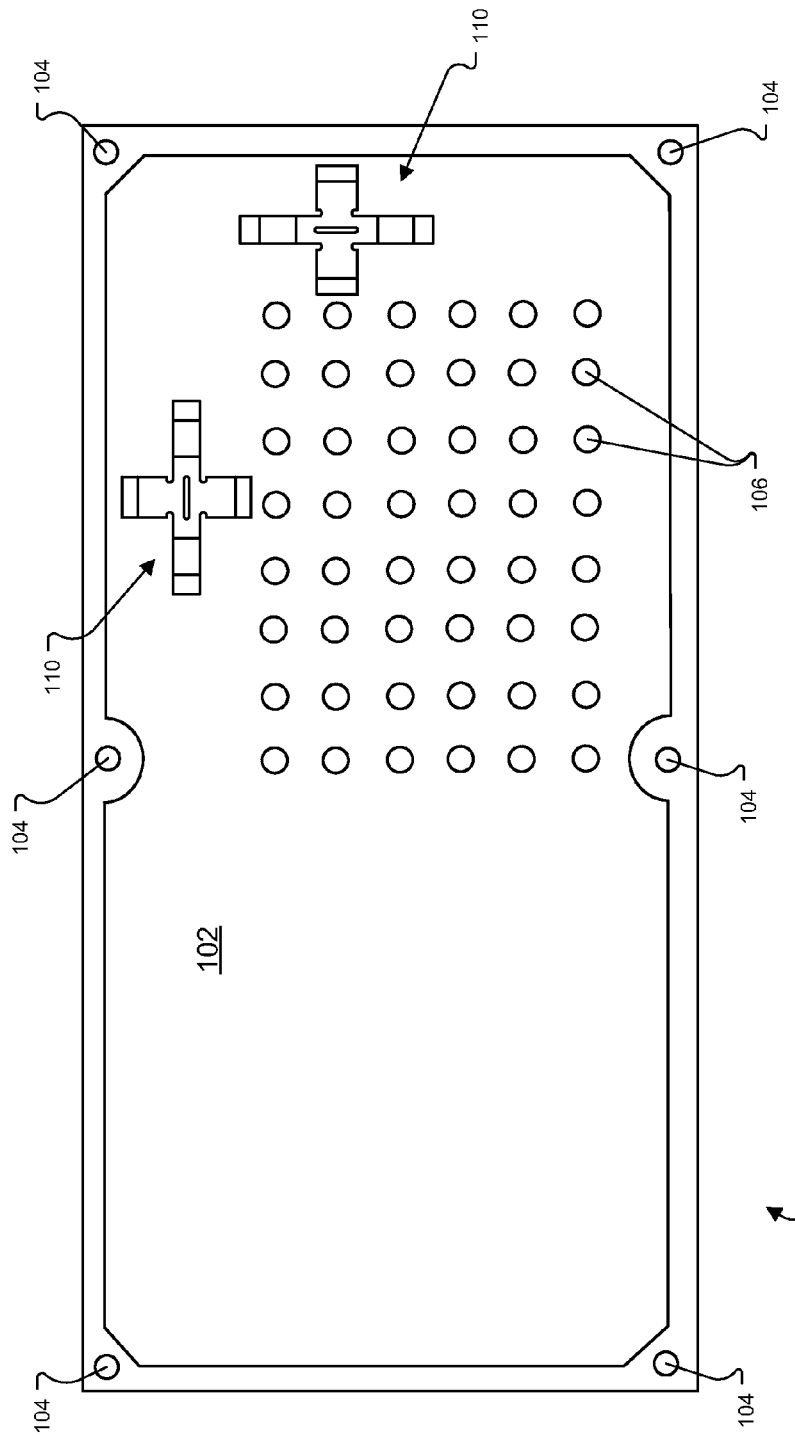
FIG. 6 is a bottom view of a housing cover including a number of contact members including pivotable spring fingers for engaging portions of a circuit board.
Figure 7A:
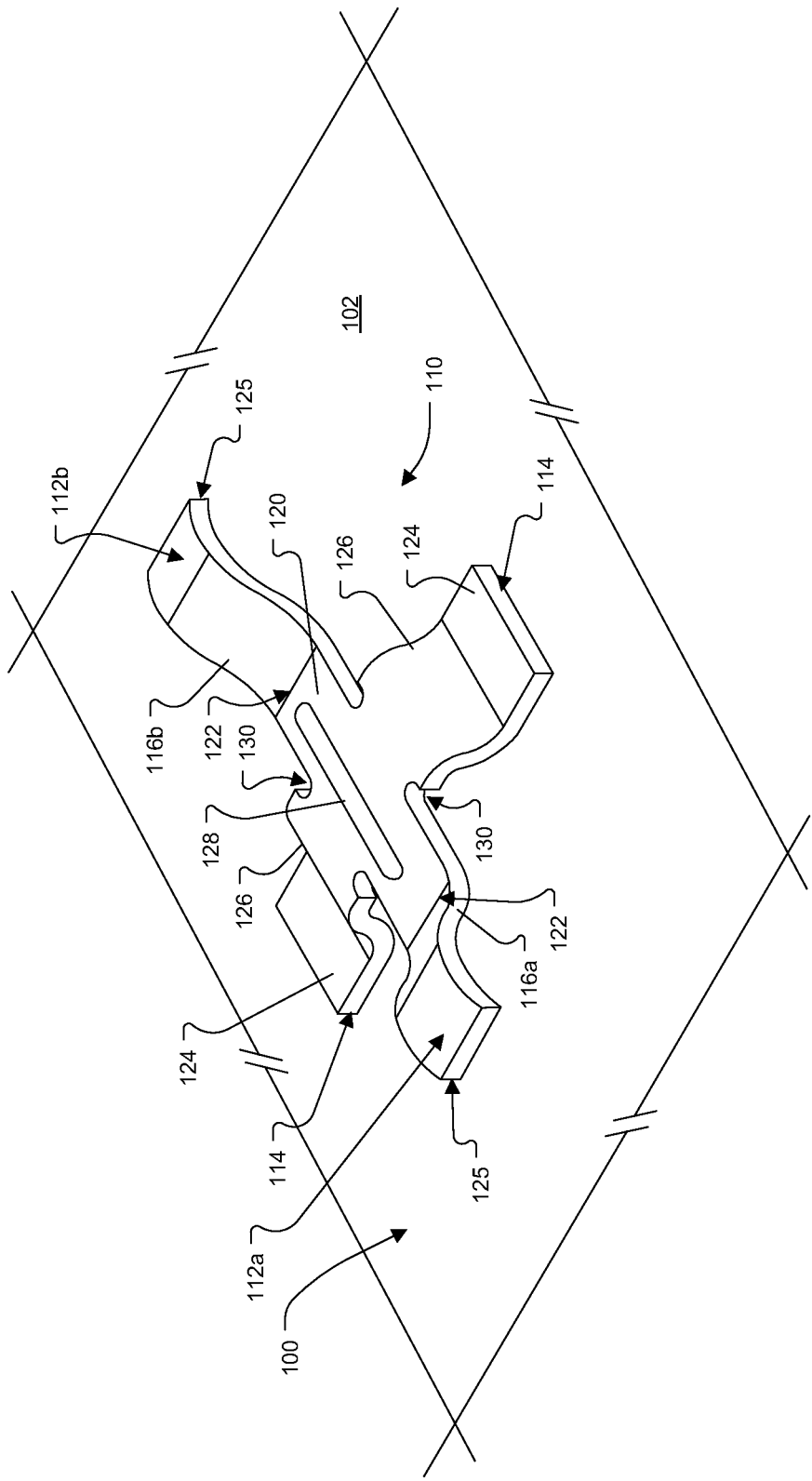
FIGS. 7A and 7B are enlarged perspective and plan views, respectively, of one of the contact members of FIG. 6.
Figure 7B:
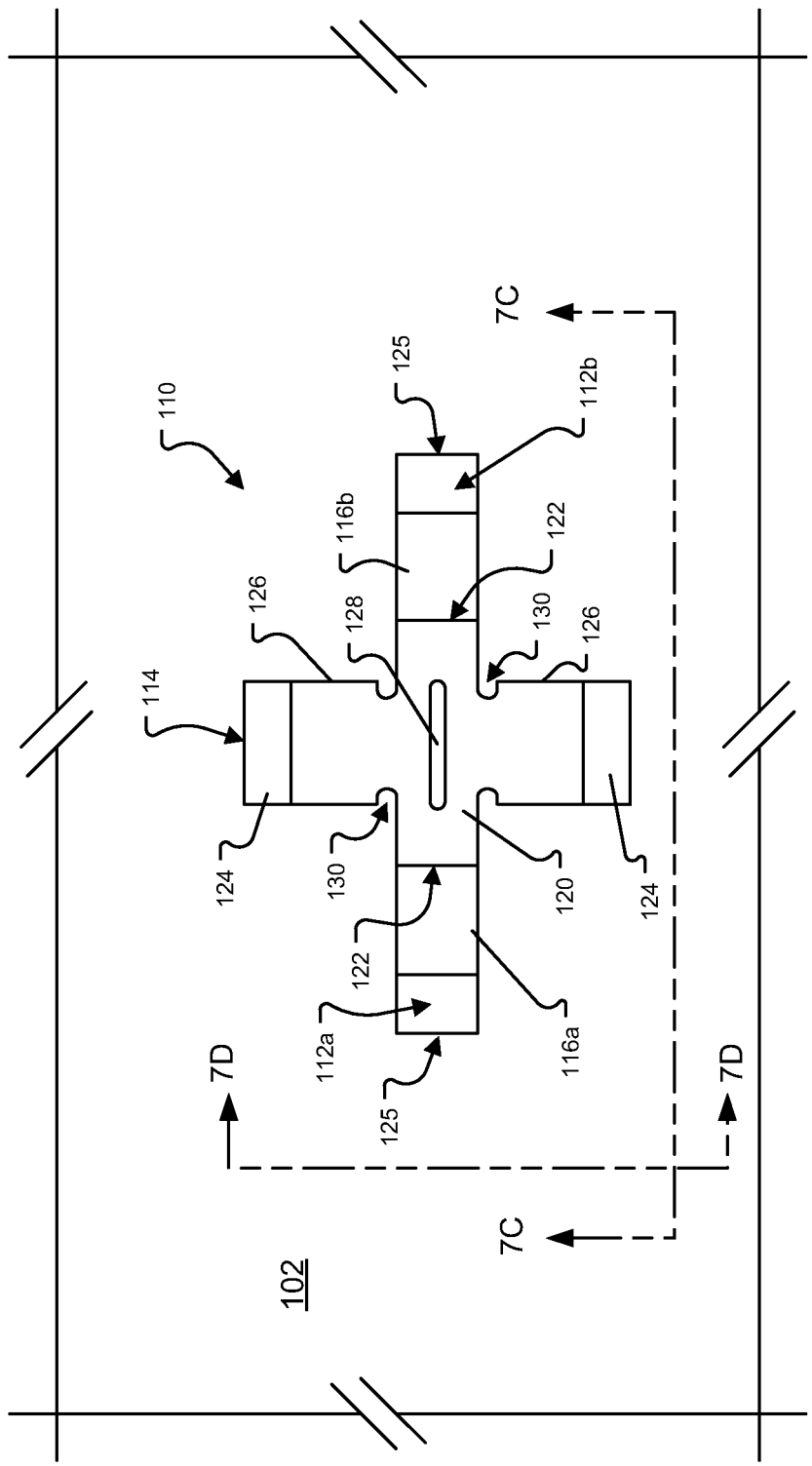
Figure 7C:
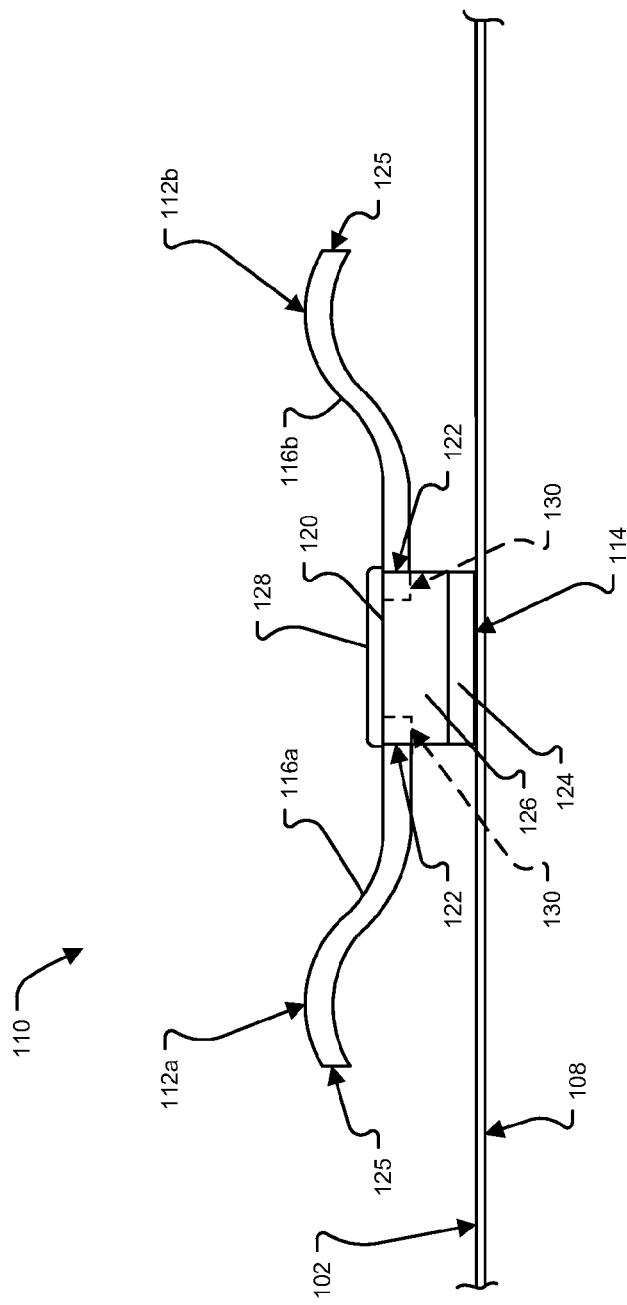
FIGS. 7C and 7D are cross-sectional views taken along lines 7C-7C and 7D-7D, respectively, of FIG. 7B.
Figure 7D:
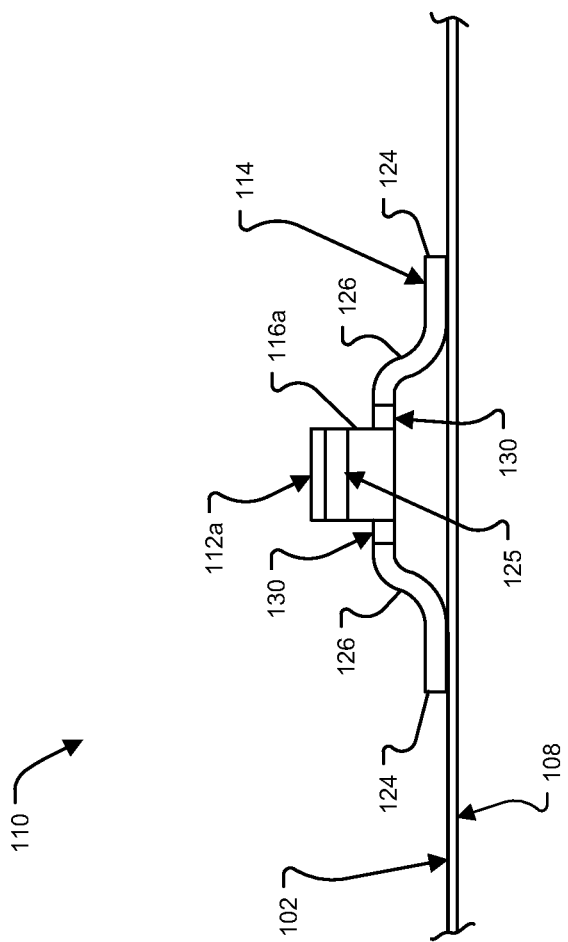

FIG. 6 illustrates an alternative housing cover 100 that can be used in place of the housing cover 35 in the amplifier of FIG. 1. The housing cover 100 includes contact members 110 which are formed separately from (i.e., as a separate part) and are mounted to the housing cover 100. The housing cover 100 is configured to have an inner surface 102 that is substantially parallel and coextensive with the circuit board 40 (FIG. 2). The housing cover 100 can be formed in a stamping process and can include screw holes 104 for securing the housing cover to a heat sink. The housing cover 100 may also include ventilation holes 106. The contact members 110 are configured and positioned to cause electrical components on a circuit board to engage with at least one component pad of a heat sink.

With reference to FIGS. 7A, 7B, 7C, and 7D each of the contact members 110 includes a pair of projections (i.e., first and second projections 112a, 112b) which are connected to each other and are configured such that displacement of the first projection 112a in a first direction (e.g., towards the inner surface 102) causes a proportional displacement of the second projection 112b in a second direction (e.g., away from the inner surface 102).

Each contact member 110 includes a base 114 which is mounted on the inner surface 102 of the cover 100 and first and second spring fingers 116a, 116b. The first and second spring fingers 116a, 116b pivot together relative to the base. The first spring finger 116a includes an arcuate body which forms the first projection 112a. Similarly, the second spring finger 116b includes an arcuate body which forms the second projection 112b.

A cross-member 120 extends between and connects proximal ends 122 of the first and second spring fingers 116a, 116b. The base 114 includes a pair of feet 124 which are connected to the cross-member 120 via a pair of wings 126. The wings 126 hold the cross-member 120 in an elevated position above the inner surface 102 with the distal ends 125 of the first and second spring fingers 116a, 116b spaced away from the inner surface 102. In some cases, the cross-member 120 can include a boss 128 for added stiffness. The contact member 110 can also include one or more regions of reduced thickness for reduced torsional resistance. For example, radial cutouts 130 can be formed in the wings 126 proximal to the cross-member 120. These cutouts 130 can provide reduced torsional resistance at the point of contact between the cross-member 120 and the wings 126 to help facilitate rotation of the first and second spring fingers 116a, 116b relative to the base 114 and the housing cover 100.

The contact member 110 can be formed from metal and can be formed with a stamping process. The contact member 110 can be mounted on the inner surface 102 of the housing cover 100 in a manner which does not introduce any additional openings between the inner surface 102 and an outer surface 108 of the housing cover 100 opposite the inner surface 102. For example, in some cases, the contact member 110 is mounted on the housing cover 100 using a stamping process in which material of the contact member 110 and/or material of the housing cover 100 is offset to form a mechanical interlock between the two separate parts. Mounting the contact member 110 in such a manner can help to reduce the number of openings (holes) that are formed in the housing cover 100, and, consequently, can help to inhibit moisture and foreign particles from entering the region of the circuit board 40 and potentially damaging the electrical components. Other suitable techniques for mounting the contact member 110 to the housing cover 100 include welding (e.g., spot welding), brazing, and/or adhesive bonding.

Figure 8:
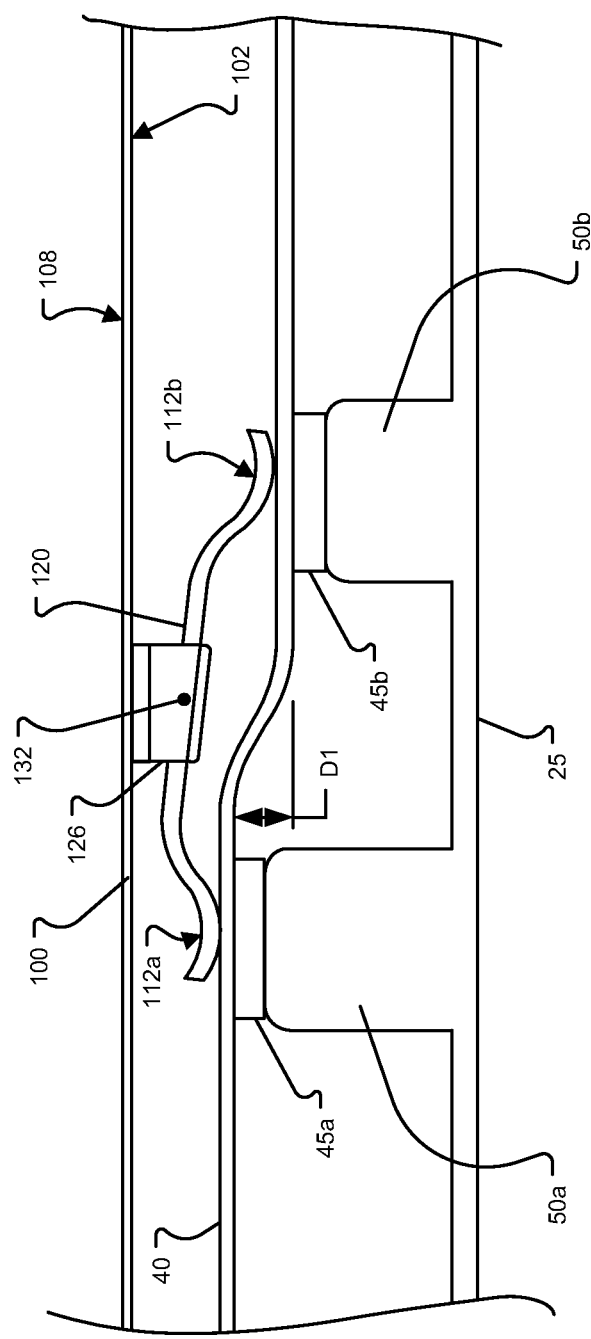
FIG. 8 is a cross-sectional view of a circuit board disposed between the housing cover of FIG. 6 and a heat sink.

Referring to FIG. 8, it is shown that the combined height of a first component pad 50a and a first electrical component 45a is greater than the combined height of a second component pad 50b and a second electrical component 45b by a distance D1. When the housing cover 100 is fitted to the heat sink 25, the height differential D1 between electrical components is accommodated by permitting the first and second projections 112a, 112b to pivot about a pivot axis 132, centered at the point of contact between the wings 126 and the cross-member 120, such that displacement of the first projection 112a in a first direction (e.g., towards the inner surface 102) causes a proportional displacement of the second projection in a second direction (e.g., away from the inner surface 102). Thus, when the downward vertical travel of the first projection 112a is stopped by the first electrical component 45a contacting the first component pad 50a, the second projection 112b is displaced downward to cause the second electrical component 45b to contact the second component pad 50b thereby helping to ensure that a conductive thermal pathway is provided for dissipating heat from the second electrical component 45b to the ambient surroundings. This configuration takes advantage of the potential height mismatch of tolerance stacks (one high and one low) and turns its initial surface contact into rotational torque so the lower surface is contacted and the gap is removed.

In some instances, the wings 126 are configured to buckle when both the first and second spring fingers 116a, 116b contact the circuit board 40 and a force applied to the circuit board 40 by the first and second spring fingers 116a, 116b exceeds a predetermined force. This can help to prevent the contact member 110 from placing too much stress or compressive force on the electrical components 45a, 45b. Often, the distance D1 is about 1 mm to about 1.5 mm. In this regard, it can be beneficial to form the contact member 110 from a material that is capable of applying a high amount of compressive force over a small distance, such as a metal (e.g., spring steel).

Figure 9B:
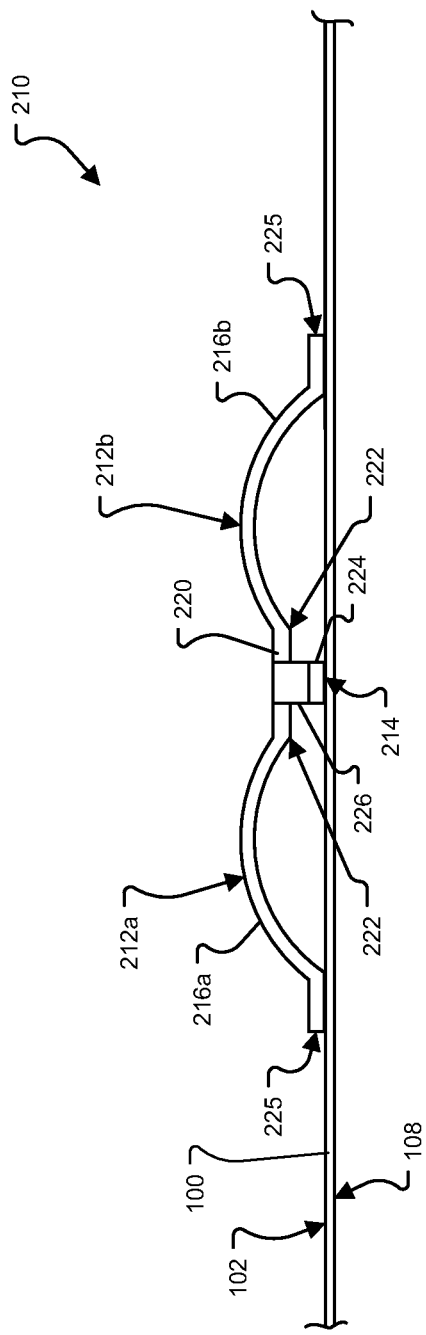
FIGS. 9B and 9C are cross-sectional views taken along lines 9B-9B and 9C-9C, respectively, of FIG. 9A.
Figure 9C:
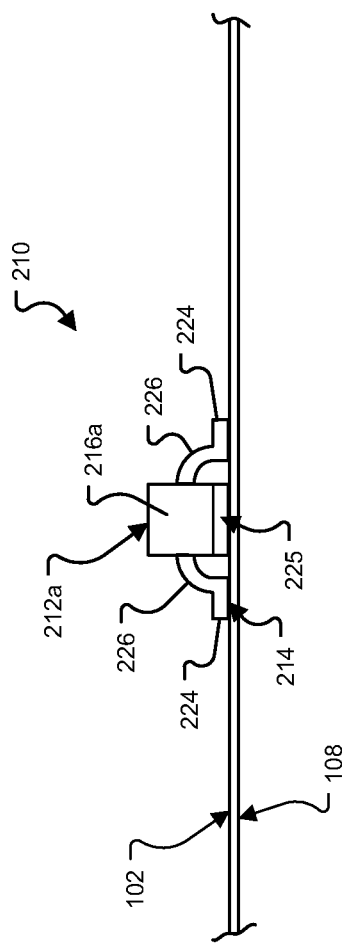

FIGS. 9A, 9B, and 9C illustrate another implementation of a contact member 210. As with the contact member described above with regard to FIGS. 7A through 7D, the contact member 210 (of FIGS. 9A-9C) includes a pair of spring fingers (i.e., first and second spring fingers 216a, 216b) whose proximal ends 222 are connected to each other via a cross-member 220. The first and second spring fingers 216a, 216b include arcuate bodies which form first and second projections 212a, 212b for contacting the circuit board 40. A base 214 comprising a pair of feet 224 is mounted to the housing cover 100 (e.g., mounted on the inner surface 102) and is connected to the cross-member 220 via a pair of wings 226. In the illustrated example, the base 214 is mounted on the inner surface 102 in a manner which does not introduce any additional openings between the inner surface 102 and an outer surface 108 of the housing cover 100 opposite the inner surface 102. The cross-member 220 can include a boss (not shown) for added stiffness. The contact member 210 can also include one or more regions of reduced thickness (e.g., cutouts (not shown) in the wings 226) for reduced torsional resistance.

Notably, in the contact member 210 of FIGS. 9A through 9C the distal ends 225 of its spring fingers 216a, 216b extend to contact the inner surface 102 of the housing cover 100. The distal ends 225 are configured to engage with the inner surface 102 in such a manner as to create a contact joint that allows the distal ends 225 to slide along the inner surface 102 as the spring fingers 216a, 216b pivot about pivot axis 232. The sliding friction between the distal ends 225 of the spring fingers 216a, 216b and the inner surface 102 of the housing cover 100 can help to increase the compression force. The distal ends 225 can be bent or curved to lay flat or tangent to the inner surface 102.

Figure 10:
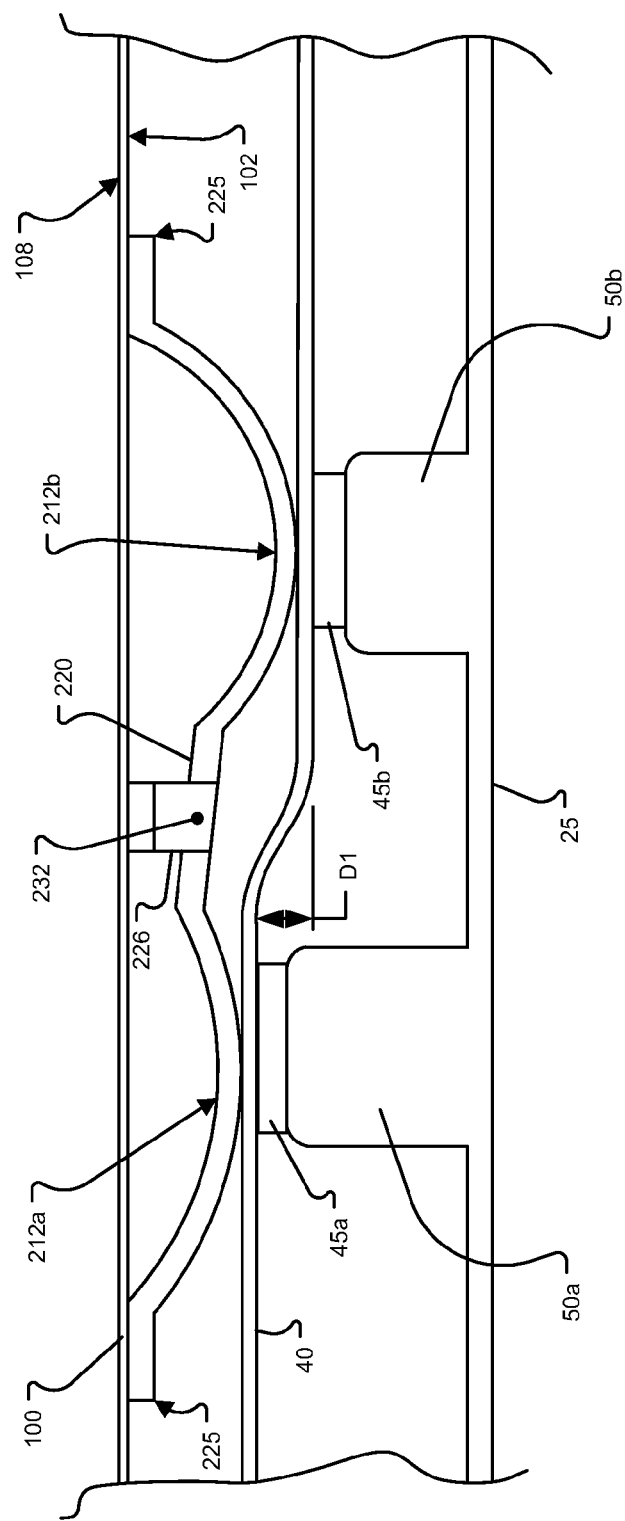
FIG. 10 is a cross-sectional view of a circuit board disposed between a housing cover including the contact member of FIG. 9A and a heat sink.

Referring to FIG. 10, when the housing cover 100 is fitted to the heat sink 25, a height differential between electrical components can be accommodated by permitting the first and second projections 212a, 212b to pivot about the pivot axis 232 such that displacement of the first projection 212a in a first direction (e.g., towards the inner surface 102) causes a proportional displacement of the second projection 212b in a second direction (e.g., away from the inner surface 102). As the first projection 212a is displaced in the first direction (i.e., as the arcuate body of the first spring finger 216a is compressed) the distal end 225 of the first spring finger 216a will slide along the inner surface 102 in a direction away from the cross-member 220 and perpendicular to the displacement of the first projection 212a. The distal end 225 of the second spring finger 216b also slides along the inner surface 102 towards the cross-member 220 as the second projection 212b is displaced in the second direction. Thus, during attachment of the housing cover 100 to the heat sink 25, when the downward vertical travel of the first projection 212a is stopped by the first electrical component 45a contacting the first component pad 50a, the second projection 212b is displaced downward to cause the second electrical component 45b to contact the second component pad 50b. As with the contact member described above, the wings 226 can be configured to buckle when both the first and second spring fingers 216a, 216b contact the circuit board 40 and a force applied to the circuit board 40 by the first and second spring fingers 216a, 216b exceeds a predetermined force. This can help to prevent the contact member 210 from placing too much stress or compressive force on the electrical components 45a, 45b.

Figure 11A:
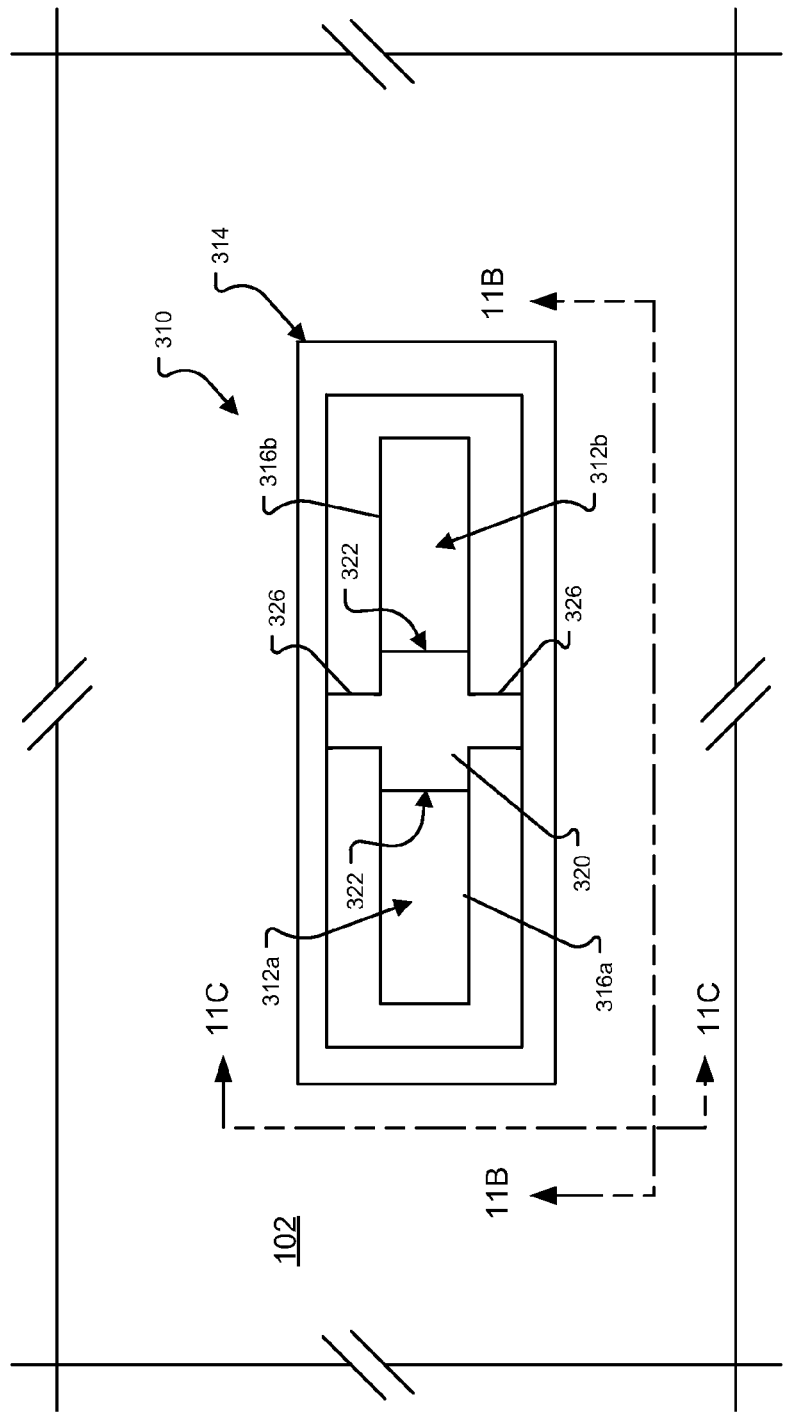
FIG. 11A is a plan view of yet another implementation of a contact member including pivotable spring fingers for engaging portions of a circuit board.
Figure 11B:
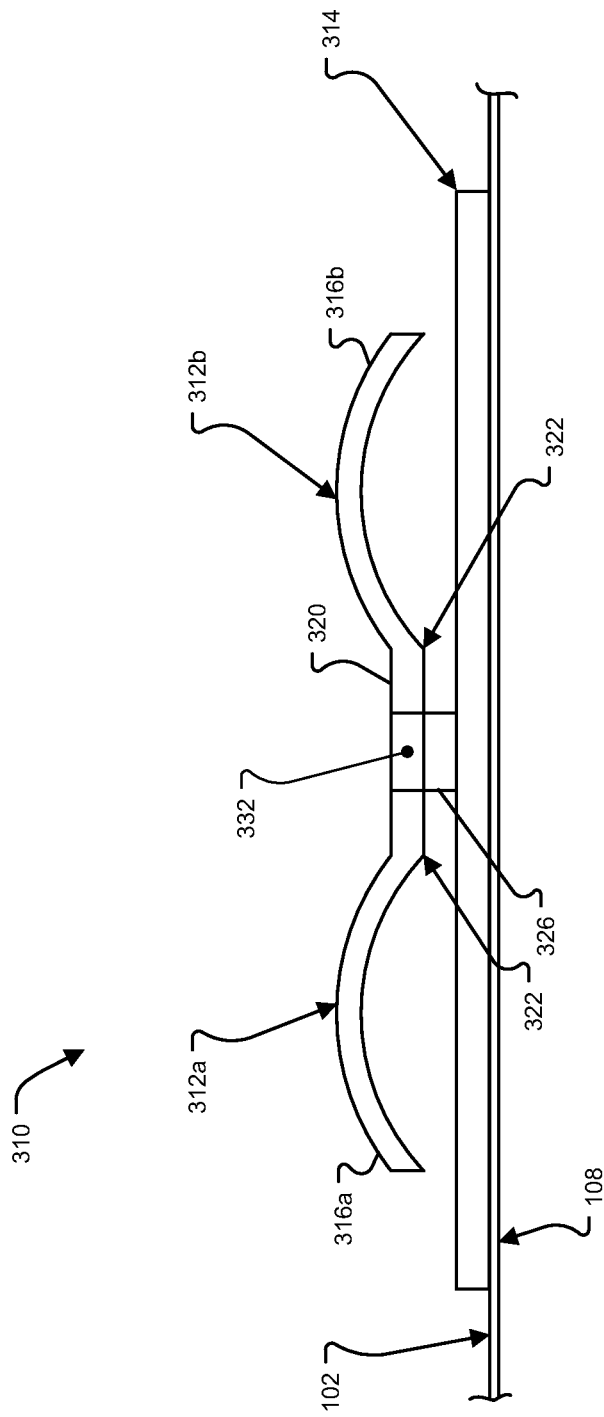
FIGS. 11B and 11C are cross-sectional views taken along lines 11B-11B and 11C-11C, respectively, of FIG. 11A.
Figure 11C:
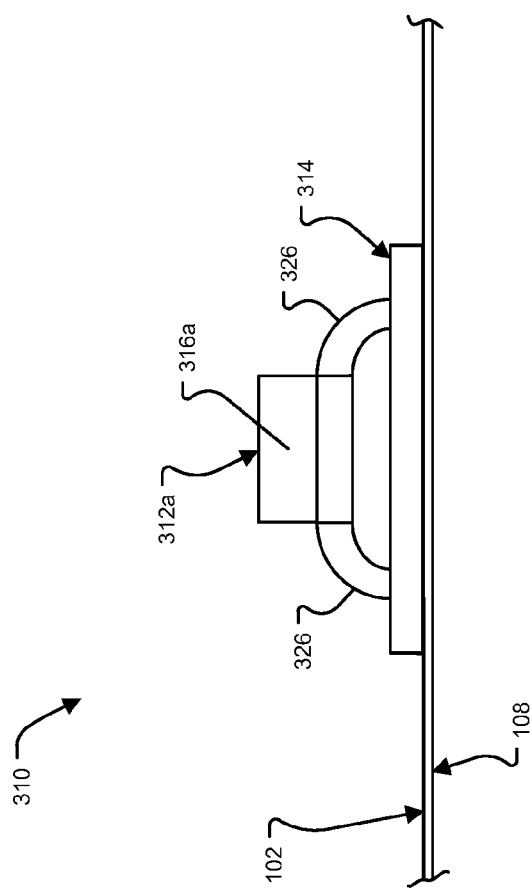

FIGS. 11A, 11B, and 11C illustrate yet another implementation of a contact member 310. As with the contact members discussed above, the contact member 310 of FIGS. 11A through 11C includes a pair of spring fingers (i.e., first and second spring fingers 316a, 316b) whose proximal ends 322 are connected to each other via a cross-member 320. The first and second spring fingers 316a, 316b include arcuate bodies which form first and second projections 312a, 312b for contacting the circuit board 40. A base 314 is mounted to the housing cover 100 (e.g., mounted on the inner surface 102) and is connected to the cross-member 120 via a pair of wings 326. The base 314 is mounted to the housing cover 100 in a manner which does not introduce any additional openings between the inner surface 102 and an outer surface 108 of the housing cover 100 opposite the inner surface 102. And, the first and second spring fingers 316a, 316b are configured to pivot together (about pivot axis 332) relative to the base 314 to accommodate for electrical component height differentials when the housing cover 100 is fitted to the heat sink 25.

Notably, in the implementation illustrated in FIGS. 11A through 11C, the base 314 extends completely around the periphery of the spring fingers 316a, 316b. The cross-member 320 can include a boss (not shown) for added stiffness. The contact member 310 can also include one or more regions of reduced thickness (e.g., cutouts (not shown) in the wings 326) for reduced torsional resistance. And, as with the contact members discussed above, the wings 326 can be configured to buckle when both the first and second spring fingers 316a, 316b contact the circuit board 40 and a force applied to the circuit board 40 by the first and second spring fingers 316a, 316b exceeds a predetermined force. This configuration can provide for a base 314 with a larger surface area, which can allow lower strength attachment means (e.g., pressure sensitive adhesive) to be used.

Figure 12A:
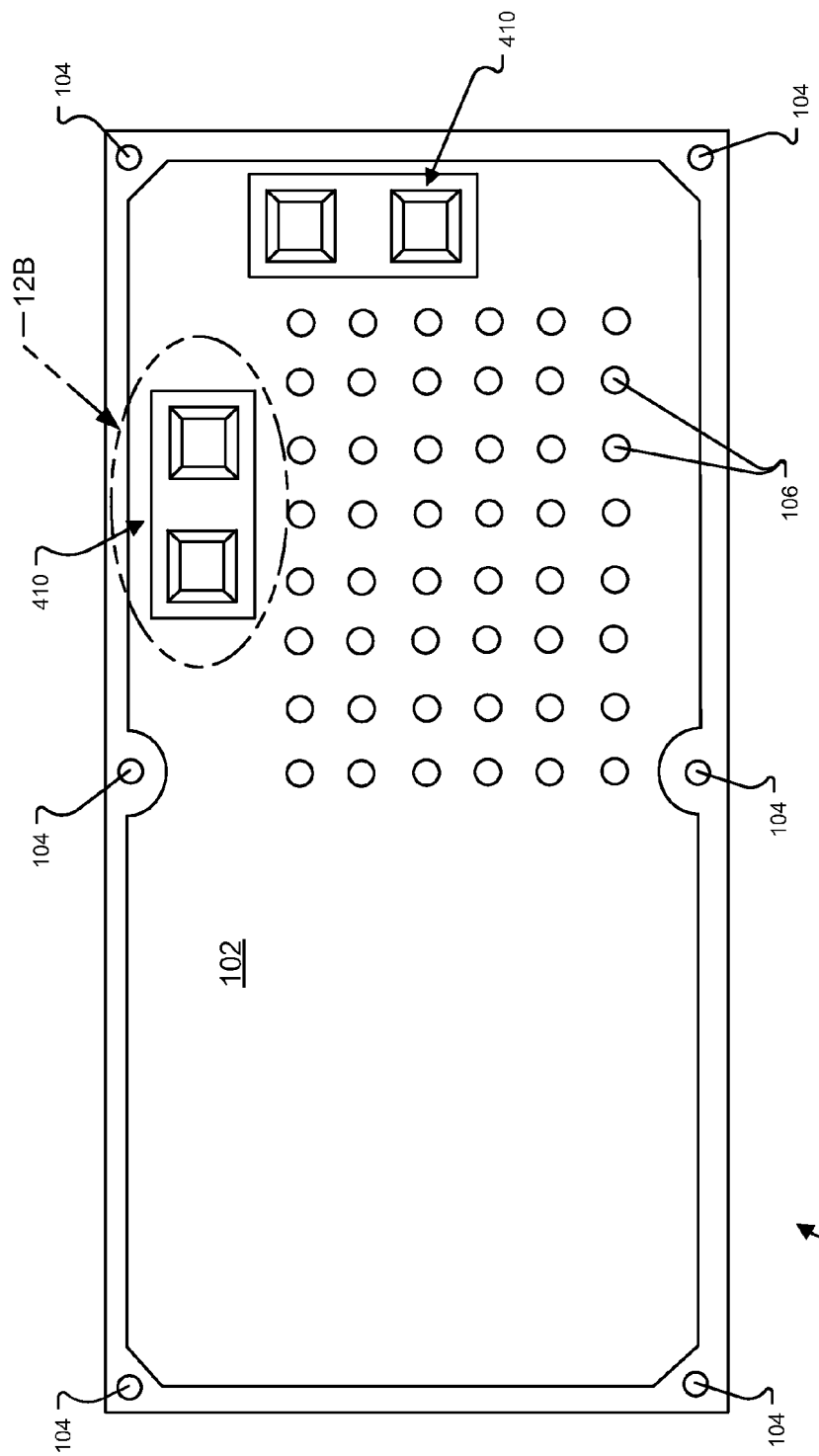
FIG. 12A is a plan view of a housing cover including a number of contact members including compressible buttons for engaging portions of a circuit board.
Figure 12B:
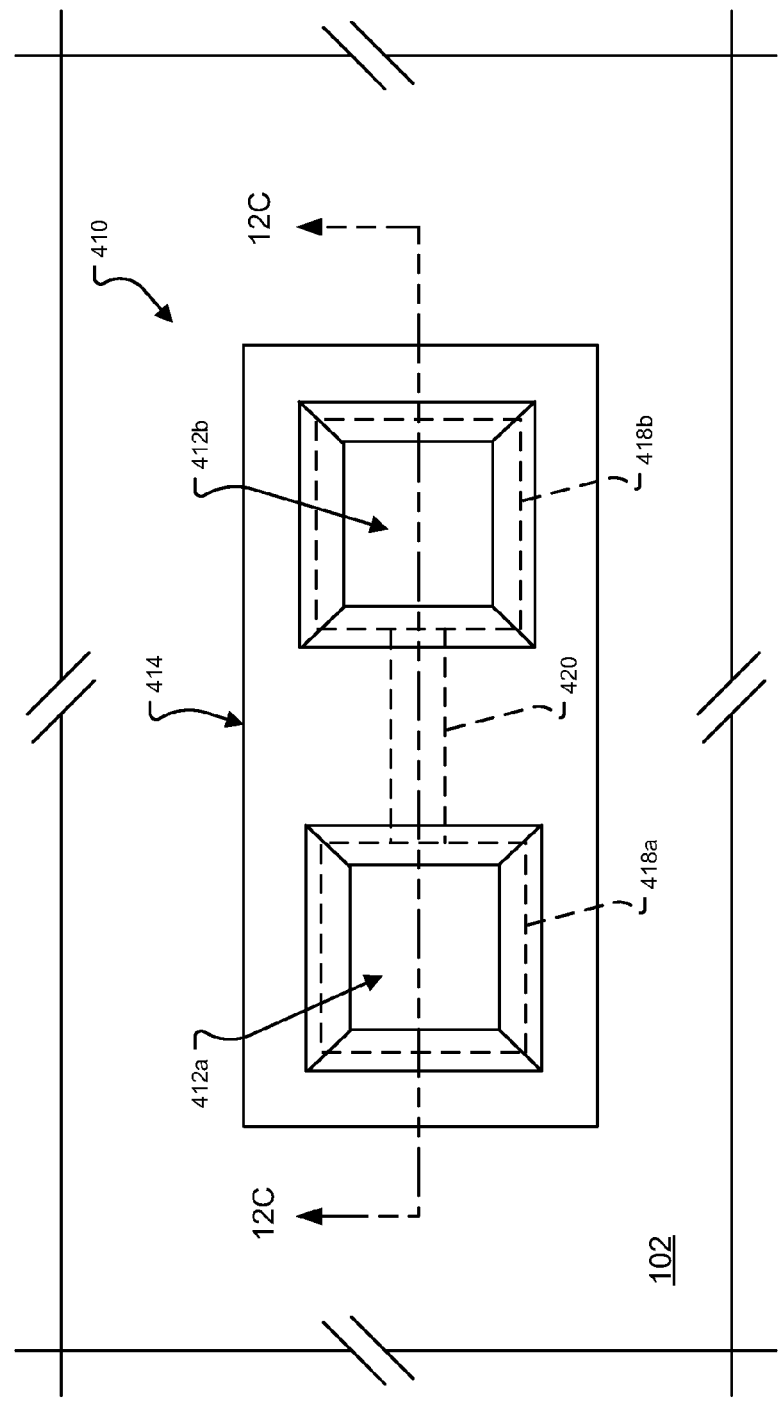
FIG. 12B is an enlarged view of one of the contact members of FIG. 12A.
Figure 12C:
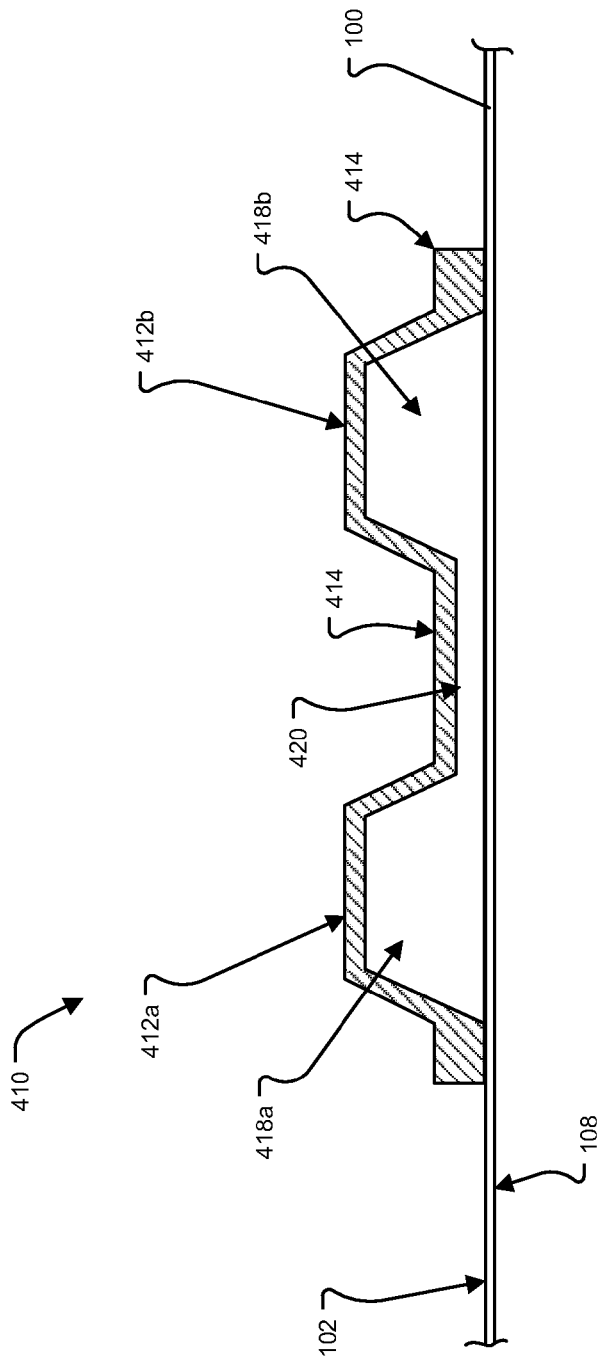
FIG. 12C is a cross-sectional view taken along line 12C-12C of FIG. 12B.

FIGS. 12A, 12B, and 12C illustrate another implementation of a contact member 410. The contact member 410 includes first and second projections 412a, 412b and a base 414 that is mounted on the inner surface 102 of the housing cover 100. In the illustrated example, the first and second projections 412a, 412b are in the form of hollow frusto-pyramidal buttons each of which define a respective fluid chamber (i.e., first and second fluid chambers 418a, 418b). A fluid conduit 420 fluidically connects the first and second fluid chambers 418a, 418b. The fluid conduit 420 can be partially formed in the base 414. For example, a channel can be formed in the base 414 between cavities beneath the first and second projections 412a, 412b and arranged such that, when the contact member 410 is mounted on the inner surface 102 of the housing cover 100, the inner surface 102 of the housing cover 100 encloses the channel and the cavities thereby forming the fluid conduit 420 (i.e., the enclosed channel) and the first and second fluid chambers 418a, 418b (i.e., the enclosed cavities). Alternatively or additionally, another layer of material, e.g., a polymeric sheet, can be laminated to the base 414 to enclose the cavities and/or the channel.

The contact member 410 is formed of a compliant material, such as a compliant polymer. Suitable polymers include silicone and urethane polymers. Silicone can be beneficial because of its high temperature resistance which can allow it to retain its compression force over a wide temperature range. The contact member 410 can be formed in a casting process in which liquid material is poured into a tool where it cures to the desired form. Alternatively or additionally, the contact member 410 can be formed in a thermal form process in which a sheet is vacuumed onto a single sided tool or is compressed to assume the desired form. Alternatively or additionally, the contact member 410 can be formed in an injection molding process. The contact member 410 can be secured to the inner surface 102 of the housing cover 100 using a pressure-sensitive adhesive (PSA) to maintain a fluid tight (e.g., air tight) seal between the contact member 410 and the housing cover 100.

Figure 13:
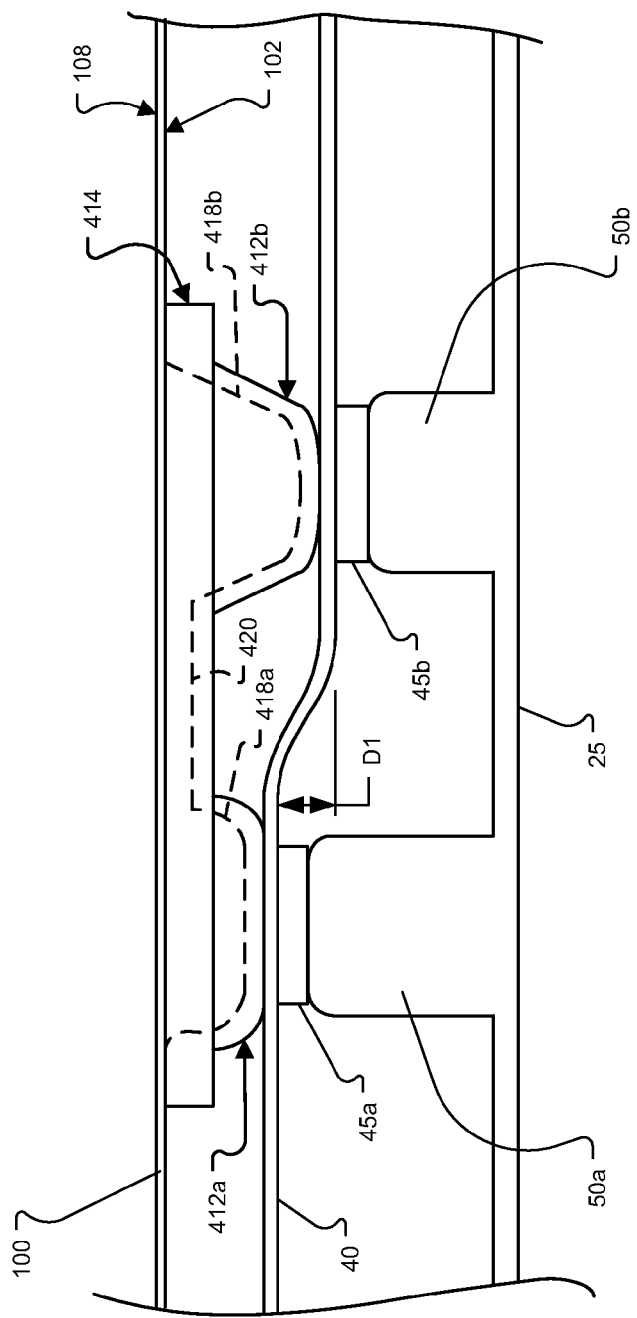
FIG. 13 is a cross-sectional view of a circuit board disposed between the housing cover of FIG. 12A and a heat sink.

Referring to FIG. 13, it is shown that the combined height of a first component pad 50a and a first electrical component 45a is greater than the combined height of a second component pad 50b and a second electrical component 45b by a distance D1. When the housing cover 100 is fitted to the heat sink 25, the height differential D1 between electrical components is accommodated by permitting the transfer of fluid between the first and second projections 412a, 412b. In this regard, compression of the first projection 412a causes displacement of fluid into the second projection 412b via the fluid conduit 420, which causes a proportional expansion of the second projection 512b. The fluid can be air or another fluid that is entrapped in the fluid chambers 418a, 418b and fluid conduit 420 when the contact member 410 is secured to the inner surface 102 of the housing cover 100. Thus, when the downward vertical travel of the first projection 412a is stopped by the first electrical component 45a contacting the first component pad 50a, causing the first projection 412a to be compressed, the second projection 412b expands downward to cause the second electrical component 45b to contact the second component pad 50b thereby helping to ensure that a conductive thermal pathway is provided for dissipating heat from the second electrical component 45b to the ambient surroundings. This configuration can provide an advantage as the first and second projections 412a, 412b could potentially be much further away from each other than the projections in a spring finger configuration.

A number of implementations have been described. Nevertheless, it will be understood that additional modifications may be made without departing from the spirit and scope of the inventive concepts described herein, and, accordingly, other implementations are within the scope of the following claims.

What is claimed is:

1. An apparatus comprising:
 a housing cover configured to be fitted to a heat sink for enclosing a circuit board therebetween; and
 a contact member formed separately from and mounted to the housing cover to cause electrical components on the circuit board to engage with the heat sink when the housing cover is fastened to the heat sink, the contact member comprising:
  first and second projections connected to each other and configured such that displacement of the first projection in a first direction causes a proportional displacement of the second projection in a second direction opposite the first direction;
  a base mounted to the housing cover; and
  first and second spring fingers connected together and connected to the base such that the first and second spring fingers pivot together relative to the base, the first spring finger defining the first projection and the second spring finger defining the second projection,
 wherein the first and second projections are configured to pivot about a pivot point such that displacement of the first projection in a first direction causes a proportional displacement of the second projection in a second direction opposite the first direction, and
 wherein the contact member includes a pair of wings connecting the base to the first and second spring fingers.

2. The apparatus of claim 1, wherein the contact member is mounted to the housing cover via a mechanical interlock formed by the contact member and the housing cover.

3. The apparatus of claim 1, wherein the contact member is mounted to the housing cover in a manner which does not introduce an opening between an inner surface of the housing cover and an opposite, outer surface of the housing cover.

4. The apparatus of claim 1, wherein the base comprises a pair of feet mounted on the inner surface, wherein the wings connect the feet to the first and second spring fingers.

5. The apparatus of claim 1, wherein the contact member comprises a cross-member connecting the first and second spring fingers to the wings, and wherein the contact member is configured such that, when a force applied to the circuit board by the first and second spring fingers exceeds a predetermined force, the cross-member is displaced towards the housing cover, thereby to limit stress on the electronic components.

6. The apparatus of claim 1, wherein the contact member comprises a cross-member connecting the first and second spring fingers to the wings, and wherein the cross-member includes a boss for added stiffness.

7. The apparatus of claim 1, wherein the contact member comprises a cross-member connecting the first and second spring fingers to the wings, and wherein cutouts are formed in the wings proximal to the cross-member for reduced torsional resistance, thereby to facilitate rotation of the first and second spring fingers relative to the base.

8. The apparatus of claim 1, wherein the wings are configured to buckle when a force applied to the circuit board by the first and second spring fingers exceeds a predetermined force, thereby to limit stress on the electronic components.

9. An apparatus comprising:
 a housing cover configured to be fitted to a heat sink for enclosing a circuit board therebetween; and
 a contact member formed separately from and mounted to the housing cover to cause electrical components on the circuit board to engage with the heat sink when the housing cover is fastened to the heat sink, the contact member comprising:
  first and second projections connected to each other and configured such that displacement of the first projection in a first direction causes a proportional displacement of the second projection in a second direction opposite the first direction;
  a base mounted to the housing cover; and
  first and second spring fingers connected together and connected to the base such that the first and second spring fingers pivot together relative to the base, the first spring finger defining the first projection and the second spring finger defining the second projection,
 wherein the first and second projections are configured to pivot about a pivot point such that displacement of the first projection in a first direction causes a proportional displacement of the second projection in a second direction opposite the first direction, and
 wherein distal ends of the first and second spring fingers contact an inner surface of the housing cover and slide along the inner surface as the first and second spring fingers are displaced towards the housing cover.

10. An apparatus comprising:
 a housing cover configured to be fitted to a heat sink for enclosing a circuit board therebetween; and
 a contact member formed separately from and mounted to the housing cover to cause electrical components on the circuit board to engage with the heat sink when the housing cover is fastened to the heat sink, the contact member comprising:
  first and second projections connected to each other and configured such that displacement of the first projection in a first direction causes a proportional displacement of the second projection in a second direction opposite the first direction,
 wherein the first and second projections are configured such that compression of the first projection causes a displacement of fluid, which, in turn, causes a proportional expansion of the second projection.

11. The apparatus of claim 10, wherein the first projection defines a first fluid chamber and the second projection defines a second fluid chamber in fluid communication with the first fluid chamber.

12. The apparatus of claim 11, wherein the contact member comprises a fluid conduit fluidically connecting the first and second fluid chambers.

13. The apparatus of claim 12, wherein the contact member comprises:
  a base mounted to the housing cover, wherein the base at least partially defines the fluid conduit.

14. The apparatus of claim 13, wherein the base and the housing cover together define the fluid conduit.

15. The apparatus of claim 10, wherein the contact member is formed of a compliant polymer.

16. The apparatus of claim 15, wherein the contact member is formed of silicone or a urethane polymer.

17. The apparatus of claim 1, wherein the contact member is mounted to the housing cover via pressure sensitive adhesive.

\* \* \* \* \*